(12) United States Patent
Harada et al.

(10) Patent No.: US 10,720,368 B2
(45) Date of Patent: Jul. 21, 2020

(54) SEMICONDUCTOR DEVICE AND METHOD FOR MANUFACTURING SAME

(71) Applicant: Mitsubishi Electric Corporation, Chiyoda-ku (JP)

(72) Inventors: Hiroyuki Harada, Chiyoda-ku (JP); Kozo Harada, Chiyoda-ku (JP); Yasumichi Hatanaka, Chiyoda-ku (JP); Takashi Nishimura, Chiyoda-ku (JP); Masaki Taya, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/073,448

(22) PCT Filed: Dec. 14, 2016

(86) PCT No.: PCT/JP2016/087228
§ 371 (c)(1),
(2) Date: Jul. 27, 2018

(87) PCT Pub. No.: WO2017/141532
PCT Pub. Date: Aug. 24, 2017

(65) Prior Publication Data
US 2019/0371686 A1 Dec. 5, 2019

(30) Foreign Application Priority Data

Feb. 16, 2016 (JP) .................................. 2016-027058

(51) Int. Cl.
*H01L 23/10* (2006.01)
*H01L 21/52* (2006.01)
(Continued)

(52) U.S. Cl.
CPC .............. *H01L 23/10* (2013.01); *H01L 21/52* (2013.01); *H01L 23/08* (2013.01); *H01L 23/32* (2013.01)

(58) Field of Classification Search
CPC ......... H01L 23/08; H01L 23/10; H01L 23/32; H01L 21/52
(Continued)

(56) References Cited

U.S. PATENT DOCUMENTS 6,914,321 B2 * 7/2005 Shinohara ........... H01L 23/4334
257/502

FOREIGN PATENT DOCUMENTS

JP 2000-311970 A 11/2000
JP 2013-149819 A 8/2013
(Continued)

OTHER PUBLICATIONS

International Search Report dated Feb. 28, 2017 in PCT/JP2016/087228 filed Dec. 14, 2016.

*Primary Examiner* — Monica D Harrison
(74) *Attorney, Agent, or Firm* — Xsensus LLP

(57) ABSTRACT

A semiconductor device includes: an insulating substrate having an upper surface on which a semiconductor element is mounted; a base plate joined to a lower surface of the insulating substrate; a case member that surrounds the insulating substrate and that is in contact with a surface of the base plate to which the insulating substrate is joined; a sealing resin provided in a region surrounded by the base plate and the case member; a cover member facing a surface of the sealing resin and fixed to the case member; and a holding plate, a lower surface of the holding plate and a portion of a side surface of the holding plate being in close contact with the surface of the sealing resin, an upper surface of the holding plate being fixed to and protruding from a
(Continued)

surface of the cover member facing the surface of the sealing resin.

10 Claims, 6 Drawing Sheets

(51) Int. Cl.
*H01L 23/08* (2006.01)
*H01L 23/32* (2006.01)
(58) Field of Classification Search
USPC .......................................................... 257/787
See application file for complete search history.

(56) References Cited

FOREIGN PATENT DOCUMENTS

| JP | 2014-130875 A | 7/2014 |
| JP | 2014-175454 A | 9/2014 |

\* cited by examiner

SEMICONDUCTOR DEVICE AND METHOD FOR MANUFACTURING SAME

TECHNICAL FIELD

The present invention relates to a sealing structure for a semiconductor device, in which a power semiconductor element is sealed with a sealing resin, as well as a method for manufacturing the sealing structure.

BACKGROUND ART

A type of semiconductor element in which a conductive path is provided in the longitudinal direction of the element in order to cope with high voltage or a large amount of current is generally referred to as a "power semiconductor element" (for example, an IGBT (Insulated Gate Bipolar Transistor), a MOSFET (Metal Oxide Semiconductor Field Effect Transistor), a bipolar transistor, a diode, or the like). A semiconductor device having a power semiconductor element mounted on a circuit board and packaged using a sealing resin has been used in a wide range of fields such as industrial devices, vehicles, and railways. In recent years, as the performance of an apparatus including such a semiconductor device becomes higher, the semiconductor device has been required to attain higher performance such as increased rated voltage and rated current, an increased operating temperature range (higher and lower temperatures), and the like.

A structure called "case structure" is mainly used for the package structure of the semiconductor device. The case type semiconductor device has such a structure that a power semiconductor element is mounted on a base plate for heat radiation with an insulating substrate being interposed therebetween and a case is adhered to the base plate. A power semiconductor element mounted inside the semiconductor device is connected to a main electrode. A bonding wire is used for the connection between the power semiconductor element and the main electrode. Generally, as a sealing resin for the semiconductor device, an insulating gel filler such as a silicone gel is used in order to prevent insulation failure under application of high voltage.

In a conventional semiconductor device, there is disclosed a semiconductor device having a structure with a holding cover inserted in close contact with the upper surface of a silicone gel in order to prevent a bonding wire from being disconnected by movement of the silicone gel, wherein the holding cover has a side surface that is provided with a protrusion engaged with the inner wall of an outer case so as to be movable upward and downward (for example, Patent Document 1).

Moreover, in addition to this, there is disclosed a semiconductor device having a structure including a cover portion that covers the upper surface of silicone gel and that has an end portion fixed to a case, wherein at least 80% of the upper surface of the silicone gel is in contact with the cover portion in a temperature range in which use thereof is permitted (for example, Patent Document 2).

CITATION LIST

Patent Document

PTD 1: Japanese Patent Laying-Open No. 2000-311970 (page 3; FIG. 1)

PTD 2: Japanese Patent Laying-Open No. 2014-130875 (page 4; FIG. 1)

SUMMARY OF INVENTION

Technical Problem

Generally, as the temperature is higher, a smaller amount of gas can be dissolved in the silicone gel. Therefore, as the operating temperature range of the semiconductor device is increased and the silicone gel is used at a higher temperature, an excess of gas, which is unable to be dissolved in the silicone gel, forms bubbles therein. At a location with such formed bubbles, an effect of insulation sealing by the silicone gel is not obtained. Accordingly, the insulation performance of the semiconductor device is deteriorated.

In order to suppress the occurrence of bubbles in the silicone gel as well as detachment thereof, the internal stress of the silicone gel should be compressive stress. This is because tensile stress increases and promotes the bubbles and detachment.

However, in the semiconductor device described in Patent Document 1, even though the holding cover is inserted in close contact with the upper surface of the sealing resin, the holding cover is movable upward and downward with respect to the inner wall of the outer case. Accordingly, when the power semiconductor element is operated at a high temperature, the sealing resin can be thermally expanded to readily push up the holding cover, with the result that no compressive stress for suppressing the occurrence of bubbles is generated. Accordingly, the insulation performance of the semiconductor device is deteriorated.

On the other hand, in the semiconductor device described in Patent Document 2, since the end portion of the cover portion is fixed to the case, the holding plate cannot be pushed up by the silicone gel thermally expanded at a high temperature, with the result that the internal stress of the silicone gel becomes compressive stress. Accordingly, the occurrence of bubbles is suppressed. However, since the end portion of the cover portion is fixed to the case, the silicone gel is pulled to the cover portion at a low temperature while being thermally contracted, with the result that the internal stress of the silicone gel becomes tensile stress. When the internal stress of the silicone gel is tensile stress, a minute bubble, if any, in the silicone gel is increased in size by the tensile stress.

Moreover, if there is a portion with weak adhesion at an interface between the silicone gel and the insulating substrate, an interface between the silicone gel and the power semiconductor element, or an interface between the gel and the wire, the tensile stress causes or promotes detachment at the interface. At a location with such formed bubbles or detachment, the effect of insulation sealing by the silicone gel is not obtained. Accordingly, the insulation performance of the semiconductor device is deteriorated.

Further, as higher voltage is used in the semiconductor device, dielectric breakdown is more likely to occur even when the sizes of the bubbles or detachment are smaller. Accordingly, the insulation performance of the module is deteriorated.

As such, the insulation performance of the conventional semiconductor device is deteriorated when the semiconductor device is used at a higher or lower temperature in the increased operating temperature range of the semiconductor device or when higher voltage is used for the semiconductor device, disadvantageously.

The present invention has been made to solve the above-described problem, and has an object to obtain a semiconductor device having insulation performance that is not deteriorated even under a high temperature, a low temperature, and a high voltage used therein, by suppressing occurrence of bubbles and detachment of silicone gel from an insulating substrate.

Solution to Problem

A semiconductor device according to the present invention includes: an insulating substrate having an upper surface on which a semiconductor element is mounted; a base plate joined to a lower surface of the insulating substrate; a case member that surrounds the insulating substrate and that is in contact with a surface of the base plate to which the insulating substrate is joined; a sealing resin provided in a region surrounded by the base plate and the case member, so as to seal the insulating substrate; a cover member facing a surface of the sealing resin and fixed to the case member; and a holding plate, a lower surface of the holding plate and a portion of a side surface of the holding plate being in close contact with the surface of the sealing resin, an upper surface of the holding plate being fixed to and protruding from a surface of the cover member facing the surface of the sealing resin.

Advantageous Effects of Invention

According to the present invention, the holding plate in close contact with the sealing resin is provided between the sealing resin and the cover in the semiconductor device, whereby compressive stress can be generated with respect to the sealing resin in the direction toward the insulating substrate during heat cycle. As a result, reliability of the semiconductor device in the heat cycle can be improved.

DESCRIPTION OF EMBODIMENTS

The following describes embodiments of a semiconductor device of the present invention in detail with reference to figures. It should be noted that the present invention is not limited to the description below and can be appropriately modified without deviating from the gist of the present invention.

First Embodiment

Figure 1:
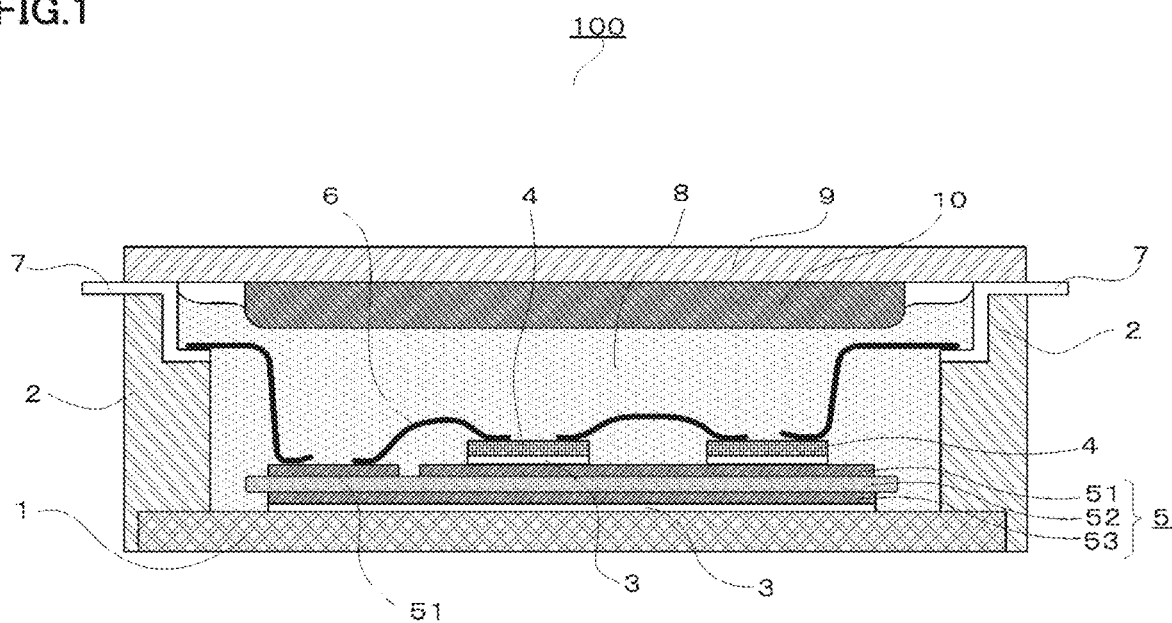
FIG. 1 is a schematic cross sectional structure view showing a semiconductor device in a first embodiment of the present invention.

FIG. 1 is a schematic cross sectional structure view showing a semiconductor device in a first embodiment of the present invention. In the figure, a semiconductor device 100 includes: a base plate 1; a case member 2; a joining material 3; power semiconductor elements 4 each serving as a semiconductor element; an insulating substrate 5; bonding wires 6; a terminal 7; a silicone gel 8 serving as a sealing resin; a cover 9 serving as a cover member; a holding plate 10; electrode patterns 51, 53; and an insulating layer 52.

Insulating substrate 5 has a lower surface (backside surface) joined onto base plate 1 using joining material 3. Insulating substrate 5 includes insulating layer 52 and electrode patterns 51, 53. In insulating substrate 5, electrode pattern 51 is formed on the upper surface (front surface) of insulating layer 52, and electrode pattern 53 is formed on the lower surface (backside surface) of insulating substrate 5. On electrode pattern 51 formed at the upper surface side of insulating substrate 5, power semiconductor element 4 is fixed using joining material 3 such as a solder. Examples of power semiconductor element 4 used herein include: a semiconductor element for power control, such as a MOSFET or an IGBT, which controls a large amount of current; and a reflux diode.

Moreover, in insulating substrate 5, electrode pattern 53 at the lower surface side of insulating substrate 5 is fixed to base plate 1 using joining material 3 such as a solder. A region (hereinafter, referred to as "case") surrounded by base plate 1 and case member 2 disposed around base plate 1 is formed with base plate 1 serving as a bottom plate.

In order to secure insulation in semiconductor device 100, silicone gel 8 serving as a sealing resin is provided in the case. Silicone gel 8 is provided in this case up to a height with which power semiconductor element 4 and bonding wire 6 are sealed in silicone gel 8.

An interconnection such as bonding wire 6 is connected to power semiconductor element 4 in order to electrically connect an electrode of power semiconductor element 4 to outside. Further, this bonding wire 6 is connected to terminal 7 and is therefore electrically connected to outside of the case. Terminal 7 is formed in case member 2 by insert molding or outsert molding.

Cover 9 is disposed at an upper portion side of case member 2 (opposite to its portion in contact with base plate 1). Cover 9 separates inside and outside of semiconductor device 100, thereby preventing entry of dust or the like into semiconductor device 100. Cover 9 is fixed to case member 2 using an adhesive agent (not shown) or a screw (not shown).

Holding plate 10 is disposed to be connected to the lower surface of cover 9, which is the case inner side of cover 9, i.e., is disposed to be connected to the surface side of cover 9 facing silicone gel 8. Holding plate 10 is disposed in contact with silicone gel 8. Holding plate 10 is disposed to protrude from cover 9, whereby holding plate 10 and silicone gel 8 are disposed in contact with each other. Accordingly, compressive stress is generated in silicone gel 8 by holding plate 10 in a direction from holding plate 10 toward insulating substrate 5.

The following describes details of each component.

A large effect is obtained when a semiconductor element employing a semiconductor material allowing for an operation at more than or equal to 150° C. is applied as power semiconductor element 4. Particularly, a large effect is obtained when a so-called "wide band gap semiconductor" is applied. The wide band gap semiconductor is composed of a material such as a silicon carbide (SiC) based material, a gallium nitride (GaN) based material or diamond (C), and has a band gap larger than that of silicon (Si).

Moreover, by way of example, FIG. 1 shows that two power semiconductor elements 4 are mounted in one sealed semiconductor device 100; however, the number of power semiconductor elements 4 is not limited to this and a required number of power semiconductor elements 4 can be mounted depending on application of use and circuit configuration.

Although the solder is used as joining material 3, joining material 3 is not limited to this. Silver or a silver alloy may be used to join power semiconductor element 4 and electrode pattern 51, and may be used to join electrode pattern 53 and base plate 1.

Each of electrode patterns 51, 53, base plate 1, and terminal 7 is normally composed of copper; however, the material thereof is not limited to this. Any material may be employed as long as the material has a required heat radiation characteristic. For example, aluminum or iron may be used, or a material in combination with them may be used. Moreover, a composite material such as copper/Invar/copper may be used, or an alloy such as AlSiC or CuMo may be used.

A surface of the material used for each of electrode patterns 51, 53, base plate 1, and terminal 7 is normally plated with nickel; however, the plating is not limited to this and gold plating or tin plating may be performed. Any structure may be employed as long as required current and voltage can be supplied to power semiconductor element 4. Moreover, since at least a portion of terminal 7 and electrode pattern 51 are embedded in sealing resin 8, minute irregularities may be provided at surfaces of terminal 7 and electrode pattern 51 in order to improve adhesion between sealing resin 8 and each of terminal 7 and electrode pattern 51. Accordingly, the adhesion between sealing resin 8 and each of terminal 7 and electrode pattern 51 can be improved.

In insulating substrate 5, electrode patterns 51, 53 each composed of copper or aluminum are provided on the respective surfaces of insulating layer 52 employing a ceramic such as Al2O3, SiO2, AlN, BN, or Si3N4. The material of insulating substrate 5, which needs to have a heat radiation property and an insulating property, is not limited to the above-described material. In insulating substrate 5, electrode patterns 51 and 53 may be provided on insulating layer 52 such as a cured resin having ceramic powder dispersed therein or a cured resin having a ceramic plate embedded therein.

Moreover, for the ceramic powder used for insulating substrate 5 (insulating layer 52), Al2O3, SiO2, AlN, BN, Si3N4, or the like is used; however, the ceramic powder is not limited to these, and diamond, SiC, B2O3, or the like may be used. Further, powder of a resin, such as a silicone resin or an acrylic resin, may be used.

Such powder often has a spherical shape; however, the shape is not limited to this and a granular shape, a grain-like shape, a flaky shape, an aggregate, or the like may be employed. An amount of the provided powder may be such an amount that required heat radiation property and insulating property are obtained. Although an epoxy resin is normally used for the resin for insulating substrate 5 (insulating layer 52), the resin is not limited to this and a polyimide resin, a silicone resin, an acrylic resin, or the like may be used. Any material can be used as long as the material has both an insulating property and an adhesive property.

For bonding wire 6, there is used a wire material composed of aluminum or gold and having a circular cross sectional shape, but the material is not limited to this. For example, a copper plate in the form of a strip (ribbon) with a square cross sectional shape may be used. As shown in FIG. 1, in the first embodiment, four bonding wires 6 are used to connect between power semiconductor elements 4, between power semiconductor element 4 and terminal 7, and between electrode pattern 51 and terminal 7; however, bonding wires 6 are not limited thereto. A required number of bonding wires 6 each having a required thickness (size) can be provided depending on current density of power semiconductor element 4 or the like.

Moreover, bonding wire 6 can be joined to a target portion by melting a metal piece such as copper or tin or by ultrasonic joining or the like; however, the joining is not limited particularly and any method or structure can be employed as long as required current and voltage can be supplied to power semiconductor element 4.

For case member 2, it is preferable to use a resin material having a high heat softening point such as a PPS (Poly Phneylene Sulfide) resin; however, the material is not limited particularly as long as the material is not thermally deformed in an operating temperature range of semiconductor device 100 and has an insulating property.

Cover 9 is disposed at the upper portion of case member 2 to separate inside and outside of semiconductor device 100, thereby preventing entry of dust or the like into semiconductor device 100.

Holding plate 10 is disposed at the lower surface side (surface side facing silicone gel 8) of cover 9 for the purpose of contact with sealing resin 8, and is in contact with silicone gel 8, which is the material of the sealing resin. Holding plate 10 can be composed of a material such as a thermoplastic resin or a thermosetting resin. For example, when holding plate 10 is composed of the same material as the member of cover 9, holding plate 10 and cover 9 can be produced collectively in the same step as the production of cover 9 of semiconductor device 100. By producing them collectively, an operation can be simplified. Holding plate 10 protrudes toward silicone gel 8 from the surface of cover 9 facing silicone gel 8. Holding plate 10 is always in contact with silicone gel 8 in order to avoid occurrence of negative pressure (tensile stress) with respect to silicone gel 8. Since holding plate 10 is disposed to protrude from cover 9, the lower surface of holding plate 10 and a portion of the side surface of holding plate 10 are in close contact with silicone gel 8. Holding plate 10 is in contact with the surface of cured silicone gel 8 serving as the sealing resin.

In order to secure the insulation in the semiconductor device 100, silicone gel 8 is provided in the region surrounded by base plate 1 and case member 2. Silicone gel 8 is provided up to a height with which power semiconductor element 4 and bonding wire 6 are sealed in silicone gel 8.

It should be noted that the silicone resin is used as the sealing resin, for example; however, the sealing resin is not limited to this. Any resin can be used as long as the resin has desired elastic modulus and heat resistance.

Figure 2:
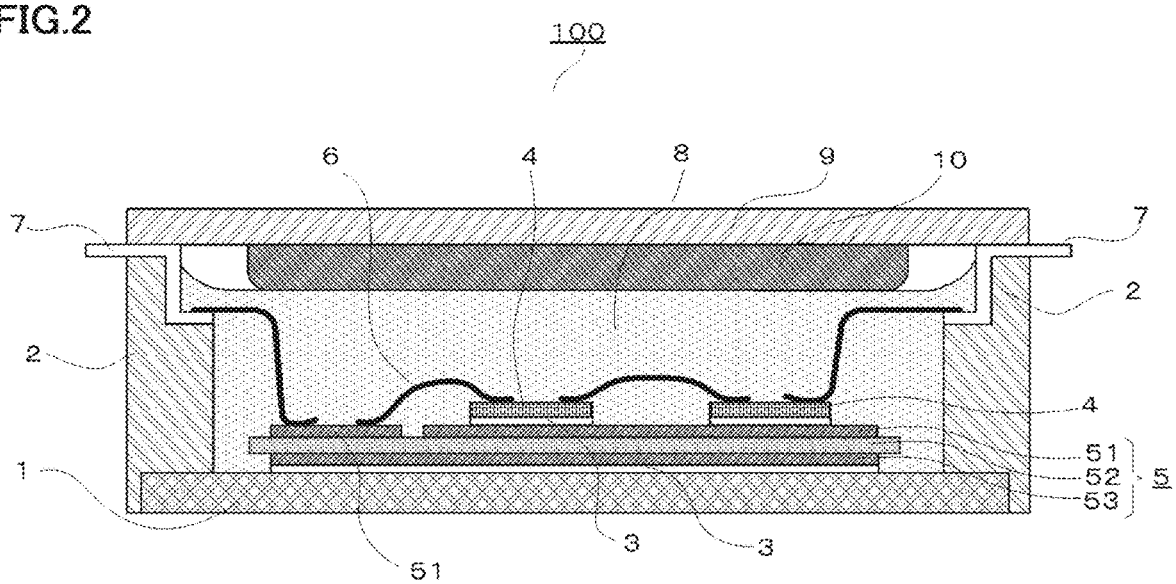
FIG. 2 is a schematic cross sectional structure view showing the semiconductor device in the first embodiment of the present invention at a low temperature.
Figure 3:
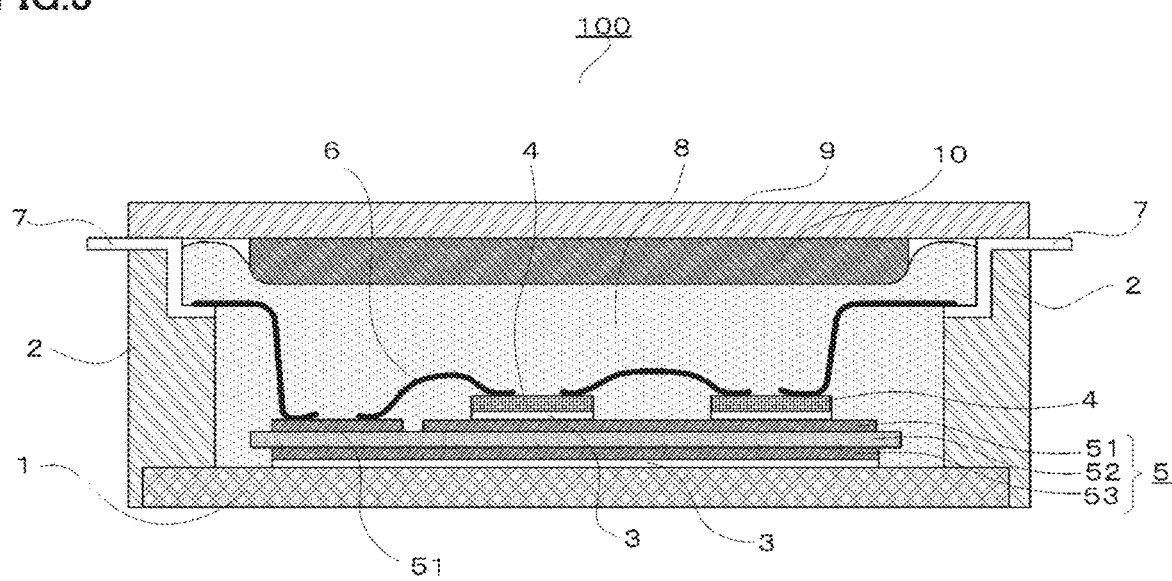
FIG. 3 is a schematic cross sectional structure view showing the semiconductor device in the first embodiment of the present invention at a high temperature.
Figure 4:
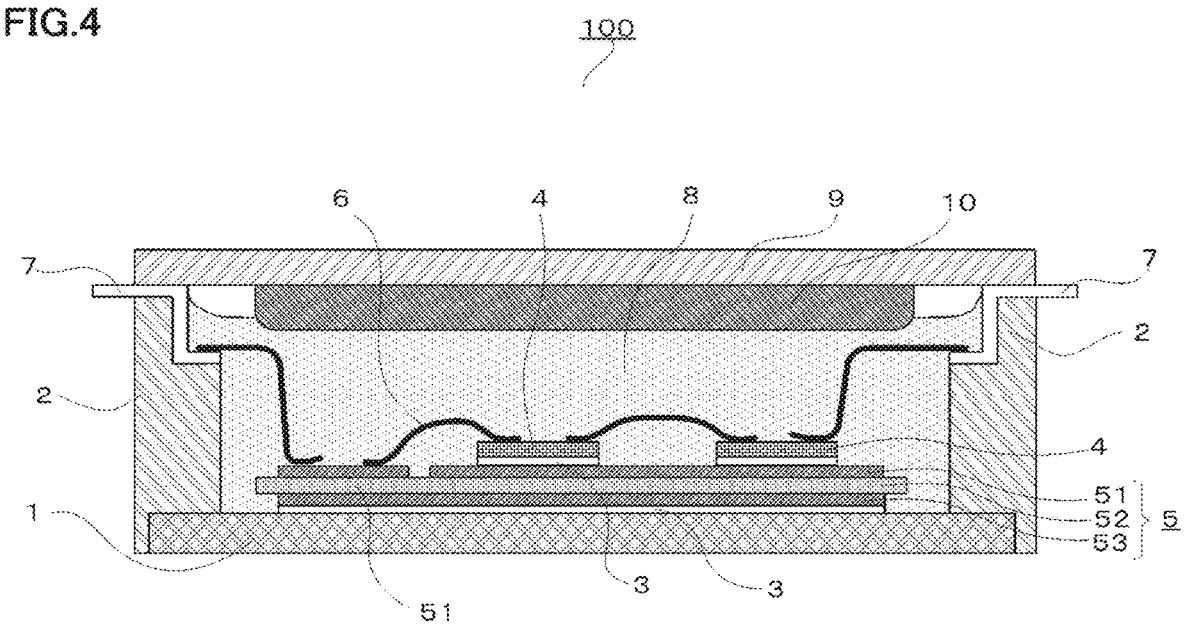
FIG. 4 is another schematic cross sectional structure view showing the semiconductor device in the first embodiment of the present invention at a low temperature.

FIG. 2 is a schematic cross sectional structure view showing the semiconductor device in the first embodiment of the present invention at a low temperature. FIG. 3 is a schematic cross sectional structure view showing the semiconductor device in the first embodiment of the present invention at a high temperature. FIG. 4 is another schematic cross sectional structure view showing the semiconductor device in the first embodiment of the present invention at a low temperature. Each of FIG. 2 and FIG. 4 is a schematic cross sectional structure view showing inside of the semiconductor device when the temperature of the semiconductor device is decreased to be less than or equal to a normal temperature. FIG. 3 is a schematic cross sectional structure view showing inside of the semiconductor device when the temperature of the semiconductor device is increased to be more than or equal to the curing temperature of the silicone gel.

The curing temperature of silicone gel 8 used for insulation sealing of semiconductor device 100 is normally 60 to 150° C. Moreover, the linear expansion coefficient of silicone gel 8 used for the insulation sealing of semiconductor device 100 is normally 300 to 500 ppm/K. On the other hand, the linear expansion coefficient of each of the other components used for semiconductor device 100 is 3 to 25 ppm/K. The linear expansion coefficient of silicone gel 8 is larger in value by several ten times to one hundred and several ten times than that of each of the other components used for semiconductor device 100.

Therefore, when the temperature of semiconductor device 100 is decreased to the normal temperature after completing the sealing step by curing silicone gel 8 provided in case 2, silicone gel 8 is thermally contracted more greatly than the other components. On this occasion, due to the thermal contraction of silicone gel 8, the height of the surface of silicone gel 8 becomes lower than the height thereof upon the curing (see FIG. 1).

Moreover, when the temperature of semiconductor device 100 becomes lower than the normal temperature, the height of the surface of silicone gel 8 becomes further lower as shown in FIG. 2. Further, as shown in FIG. 4, depending on a set temperature, the height of the surface of silicone gel 8 may correspond to a position of contact with a peripheral portion of holding plate 10.

On the other hand, when the temperature of semiconductor device 100 becomes higher than the curing temperature, silicone gel 8 is thermally expanded more greatly than the other components, with the result that the height of the surface of silicone gel 8 becomes higher than the position thereof upon the curing as shown in FIG. 3.

Here, a relation of $\Delta L = V \times \beta \times \Delta T \times 1/S$ is satisfied, where $\Delta L$ represents a change amount of silicone gel 8 due to the temperature change, S represents a surface area of silicone gel 8, V represents a volume of silicone gel 8, $\beta$ represents a volumetric expansion coefficient of silicone gel 8, and $\Delta T$ represents a temperature change amount. When an amount of pressing holding plate 10 disposed on cover 9 from the surface of silicone gel 8 is larger than change amount $\Delta L$min of silicone gel 8 at a temperature difference $\Delta T$min of the lowest temperature under an operating temperature environment of semiconductor device 100 from a temperature when pressing holding plate 10 from the surface of silicone gel 8 toward insulating substrate 5, holding plate 10 is always in contact with the surface of silicone gel 8 under the operating environment temperature of semiconductor device 100, with the result that internal stress of silicone gel 8 below holding plate 10 becomes compressive stress.

Therefore, the amount of pressing holding plate 10 in the direction from the surface of silicone gel 8 toward insulating substrate 5 is preferably set to be larger than $\Delta L$min. For example, when holding plate 10 is disposed at the room temperature (25° C.) in the case where the lowest temperature environment in which semiconductor device 100 is used is −40° C., $\Delta T$min is 65° C. and pressing amount $\Delta L$min is set accordingly. For example, $\Delta L$min=1.7 mm in the case of a semiconductor device in which sealing is performed up to a height of 20 mm with a resin having volumetric expansion coefficient $\beta$ of 1300 ppm/K. By pressing more greatly than this $\Delta L$min, the holding plate is always placed in the gel at the low temperature, whereby compressive stress can be applied.

Moreover, when holding plate 10 is disposed (pressed) at a temperature of −40° C., i.e., the lowest temperature in which semiconductor device 100 is used, $\Delta T$min is 0 and therefore pressing amount $\Delta L$min is also 0. That is, when holding plate 10 is merely on and in contact (close contact) with the surface of silicone gel 8, compressive stress is always applied to power semiconductor element 4 and insulating substrate 5 below holding plate 10 under the operating environment of semiconductor device 100. Accordingly, growth of bubbles or detachment can be suppressed and detachment of silicone gel 8 from insulating substrate 5 can be suppressed, thereby obtaining an effect of suppressing insulation deterioration of the power module. Therefore, a reliable semiconductor device under the operating environment temperature can be obtained.

It should be noted that even with a pressing amount of less than or equal to $\Delta L$min, there is obtained the effect of suppressing the bubbles and detachment, which are caused from an interface between silicone gel 8 and power semiconductor element 4 or insulating substrate 5.

Figure 5:
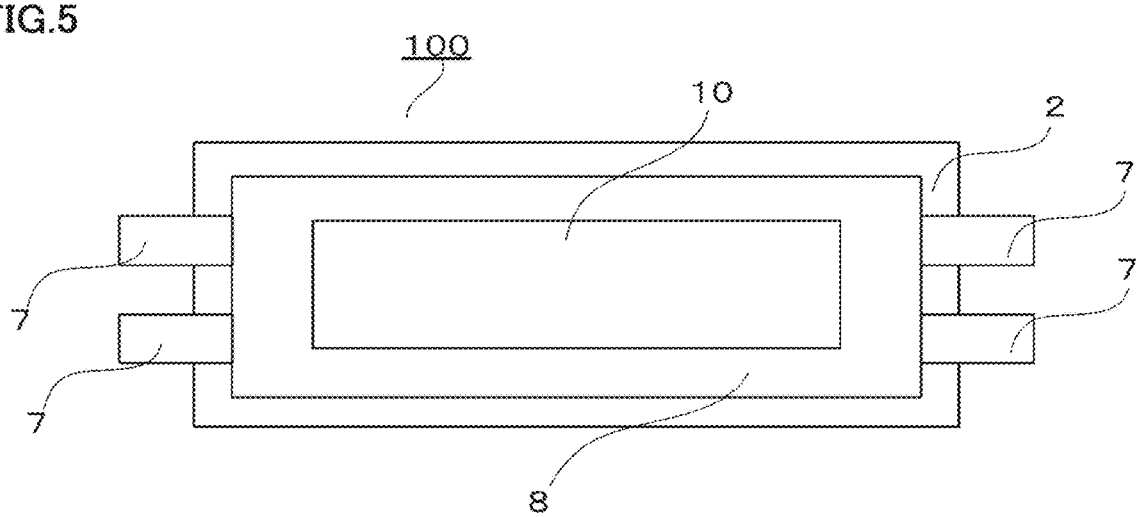
FIG. 5 is a schematic top structure view showing the semiconductor device in the first embodiment of the present invention.
Figure 6:
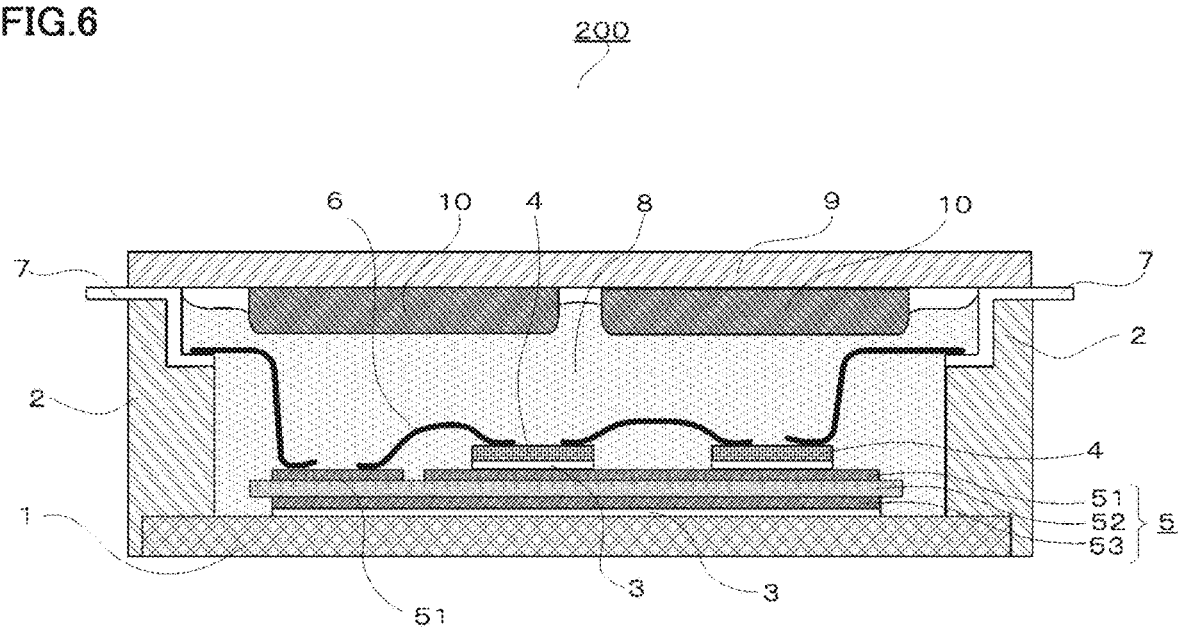
FIG. 6 is a schematic cross sectional structure view showing another semiconductor device in the first embodiment of the present invention.
Figure 7:
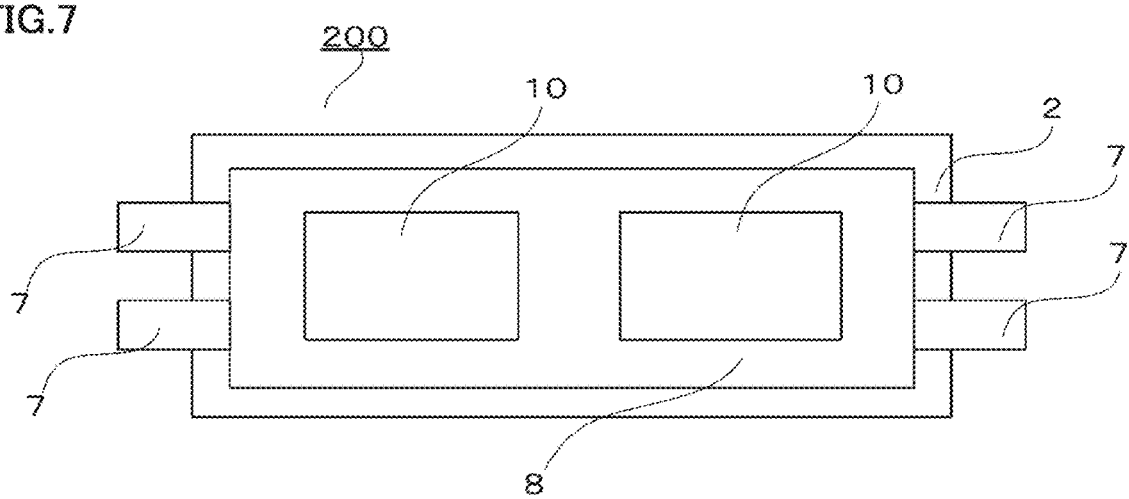
FIG. 7 is a schematic top structure view showing another semiconductor device in the first embodiment of the present invention.

FIG. 5 is a schematic top structure view showing the semiconductor device in the first embodiment of the present invention. FIG. 6 is a schematic cross sectional structure view showing another semiconductor device in the first embodiment of the present invention. FIG. 7 is a schematic top structure view showing another semiconductor device in the first embodiment of the present invention. FIG. 5 is a top structure schematic view showing a case where one holding plate 10 is provided. FIG. 6 and FIG. 7 are a schematic cross sectional structure view and a schematic top structure view each showing a case where two holding plates 10 are provided.

In semiconductor device 100 including silicone gel 8 for sealing, bubbles are generated at the following locations: a location to which bonding wire 6 is joined; an interface between insulating substrate 5 and joining material 3; an interface between the case and the adhesive agent; and the like. It is most important to secure insulation in power semiconductor element 4 and insulating substrate 5. Hence, it is preferable to dispose holding plate 10 to cover the upper surface of insulating substrate 5. The schematic top structure view shown in FIG. 5 illustrates such a structure that insulating substrate 5 is disposed below holding plate 10.

Moreover, FIG. 1 shows the case where one insulating substrate 5 is provided; however, it is applicable to a semiconductor device having two or more insulating substrates 5 mounted therein. Further, instead of one holding plate 10, a plurality of divided portions of holding plate 10 may be disposed on cover 9. For example, the same effect can be obtained also when two divided portions of holding plate 10 are disposed as in a semiconductor device 200 shown in each of FIG. 6 and FIG. 7.

Further, holding plate 10 according to the present embodiment has a flat shape at its contact portion with silicone gel 8; however, holding plate 10 may have a shape protruding in the direction toward insulating substrate 5. Holding plate 10 is pressed in the direction from the surface of silicone gel 8 toward insulating substrate 5 after curing silicone gel 8. Hence, if the breaking strength of silicone gel 8 is low, crack may be generated in silicone gel 8 from an end portion of holding plate 10 when pressing holding plate 10 into silicone gel 8. Therefore, it is preferable to round a corner of the end portion of holding plate 10.

Next, the following describes a manufacturing method according to the first embodiment. Particularly, the following describes a method for disposing cover 9 including holding plate 10.

Figure 8:
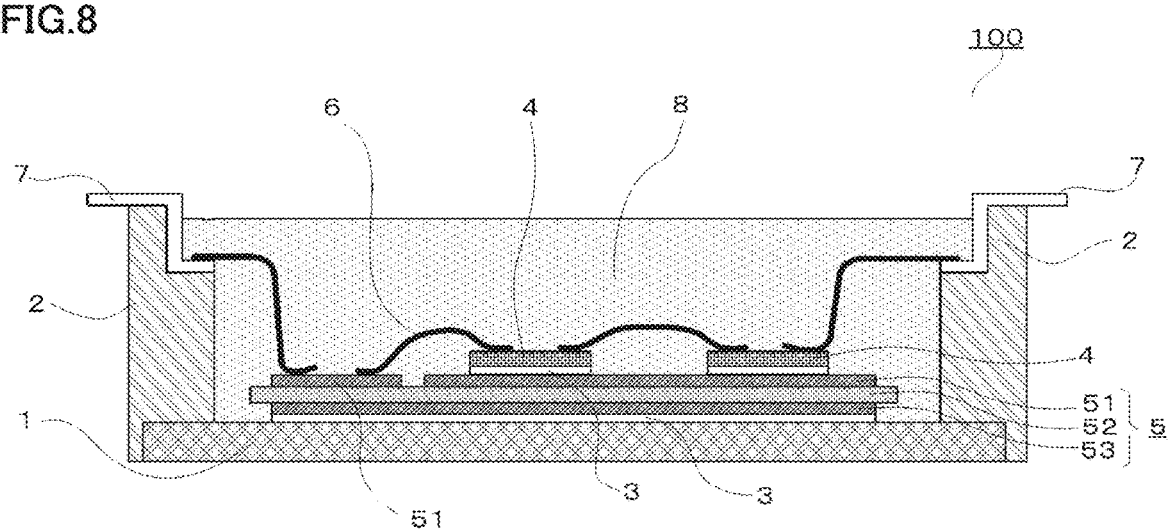
FIG. 8 is a schematic cross sectional structure view showing a step of manufacturing the semiconductor device in the first embodiment of the present invention.
Figure 9:
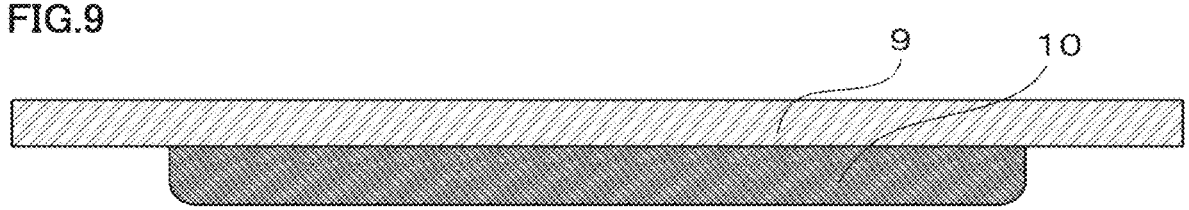
FIG. 9 is a schematic cross sectional structure view showing a step of manufacturing the semiconductor device in the first embodiment of the present invention.
Figure 10:
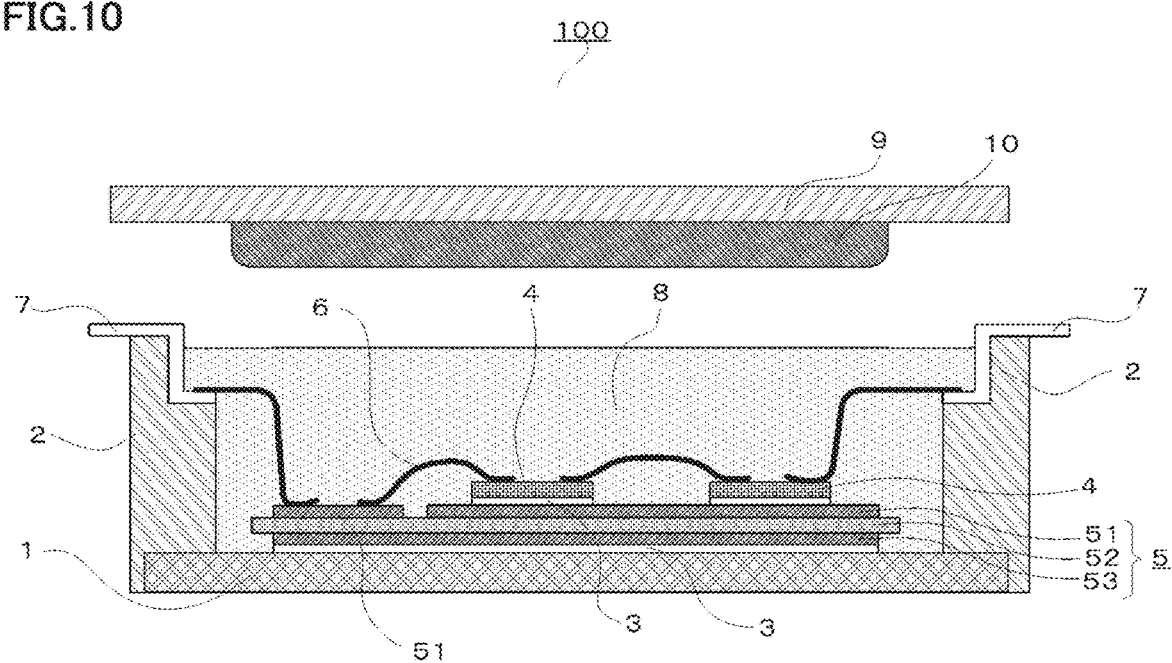
FIG. 10 is a schematic cross sectional structure view showing a step of manufacturing the semiconductor device in the first embodiment of the present invention.
Figure 11:
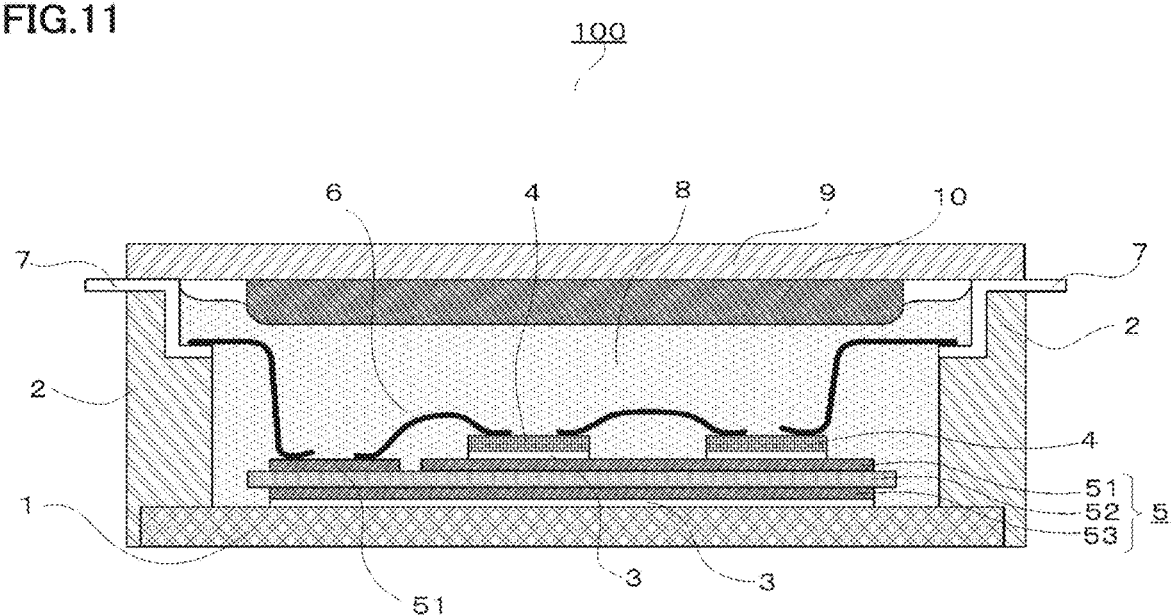
FIG. 11 is a schematic cross sectional structure view showing the step of manufacturing the semiconductor device in the first embodiment of the present invention.
Figure 12:
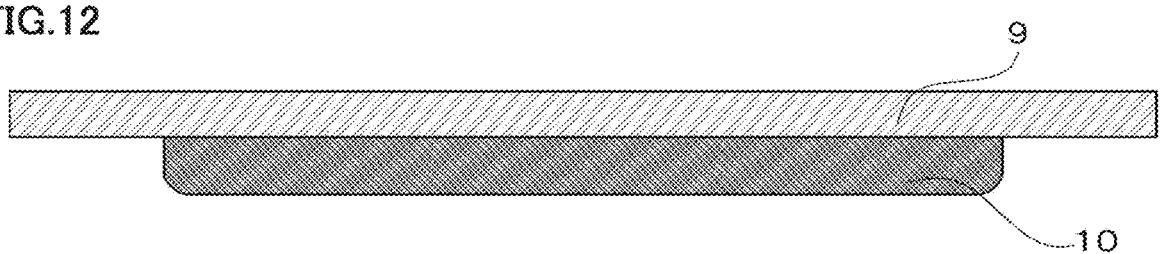
FIG. 12 is a schematic cross sectional structure view showing a cover and a holding plate in the first embodiment of the present invention.
Figure 13:
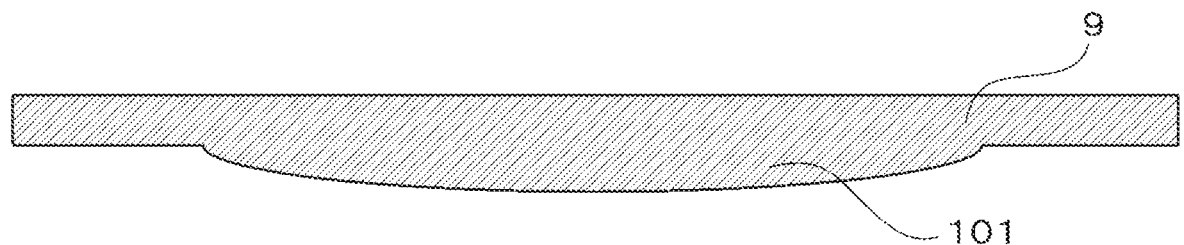
FIG. 13 is a schematic cross sectional structure view showing another cover and holding plate in the first embodiment of the present invention.
Figure 14:
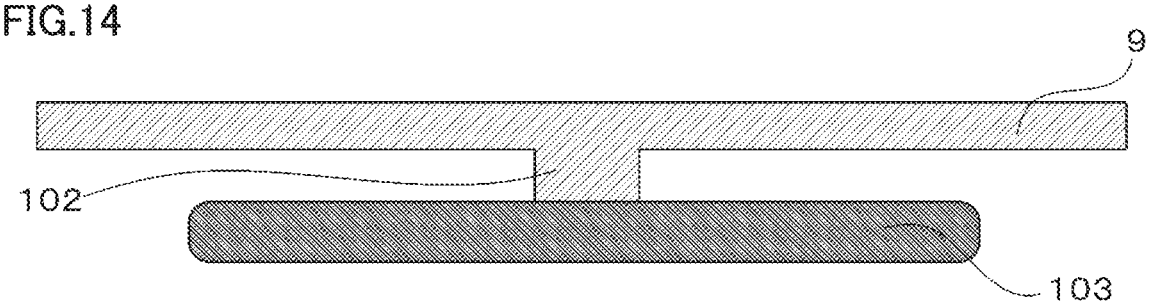
FIG. 14 is a schematic cross sectional structure view showing another cover and holding plate in the first embodiment of the present invention.

Each of FIG. 8 to FIG. 11 is a schematic cross sectional structure view showing a method for manufacturing the semiconductor device in the first embodiment of the present invention. FIG. 12 is a schematic cross sectional structure view showing the cover and the holding plate in the first embodiment of the present invention. FIG. 13 is a schematic cross sectional structure view showing another cover and holding plate in the first embodiment of the present invention. FIG. 14 is a schematic cross sectional structure view showing another cover and holding plate in the first embodiment of the present invention. FIG. 8 is a schematic cross sectional view after mounting and interconnecting power semiconductor element 4 and the like and completing sealing with the sealing resin. FIG. 9 is a schematic cross sectional structure view in which holding plate 10 is disposed on cover 9. FIG. 10 is a schematic cross sectional structure view just before attaching cover 9 to case member 2. FIG. 11 is a schematic cross sectional view of semiconductor device 100 after attaching cover 9. FIG. 12 shows a structure in which holding plate 10 is disposed on cover 9. FIG. 13 shows a structure in which a protrusion 101 serving as the holding plate is provided in cover 9. FIG. 14 shows a structure in which a plate 103 is provided on cover 9 at a bar 102.

Semiconductor device 100 can be manufactured by a process (through steps) shown in FIG. 8 to FIG. 11. FIG. 8 shows a step (member disposing step, resin providing step, and resin curing step) of preparing semiconductor device 100 before attaching cover 9. In this step, base plate 1, case member 2, insulating substrate 5, power semiconductor element 4, bonding wire 6, and silicone gel 8 are appropriately disposed, thereby forming semiconductor device 100 before attaching cover 9.

Specifically, power semiconductor element 4 is fixed using joining material 3 such as a solder to electrode pattern 51 at the front surface side of insulating substrate 5. Moreover, electrode pattern 53 at the backside surface side of insulating substrate 5 is fixed to base plate 1 using joining material 3 such as a solder (member disposing step). The region surrounded by base plate 1 and case member 2 is formed with base plate 1 serving as a bottom plate. This region serves as the case. Silicone gel 8 is provided up to such a height with which power semiconductor element 4 and bonding wire 6 are sealed in silicone gel 8 within this case (resin providing step). After sealing with silicone gel 8 in the case, semiconductor device 100 is placed under reduced pressure, thereby removing bubbles in silicone gel 8 within semiconductor device 100 (resin curing step).

Next, a step of disposing holding plate 10 on cover 9 is described. FIG. 9 shows a state after disposing holding plate 10 on cover 9. Moreover, each of FIG. 12 to FIG. 14 is a schematic cross sectional structure view showing a shape of holding plate 10. In FIG. 12, a plate-shaped structure is disposed on cover 9 as holding plate 10 (see FIG. 9). In FIG. 13, protrusion 101 shaped to protrude in the direction toward insulating substrate 5 is disposed on cover 9. In FIG. 14, plate 103 is formed at bar 102 extending from cover 9. Thus, the shape of holding plate 10 is not limited in particular as long as holding plate 10 can function to press down the sealing resin (silicone gel 8) that covers power semiconductor element 4.

Regarding the step of disposing holding plate 10 on cover 9, when the member of holding plate 10 is composed of the same material as that of the member of cover 9, holding plate 10 can be formed together with cover 9 in the same step. Moreover, when the member of cover 9 is different from the member of holding plate 10, holding plate 10 can be produced by adhering, using an adhesive agent or the like, a protrusion onto the surface of cover 9 facing insulating substrate 5. Further, when the height of holding plate 10 needs to be appropriately adjusted, the height of holding plate 10 can be adjusted by performing a threading process with respect to cover 9 and holding plate 10. In this case, first, a screw is inserted into a threaded hole provided at the cover 9 side in a direction from outside, i.e., the cover 9 side to inside. Then, a threaded hole of holding plate 10 is threaded into the protruding screw disposed at cover 9, whereby holding plate 10 can be adjusted to a predetermined height.

Next, the following describes a step (close contacting step) of compressing (bringing into close contact with) silicone gel 8 using cover 9 having holding plate 10 formed thereon. As shown in FIG. 10, silicone gel 8 is provided into the case, then silicone gel 8 is cured at a predetermined curing temperature, and then the temperature of cured silicone gel 8 is decreased to a temperature less than or equal to the room temperature. Then, cover 9 having holding plate 10 disposed thereon is disposed to bring holding plate 10 into contact with the surface of silicone gel 8 so as to press cover 9 having holding plate 10 formed thereon in a direction in which silicone gel 8 is compressed in the direction toward insulating substrate 5. Then, cover 9 is fixed at a predetermined height.

The amount of pressing holding plate 10 from the surface of silicone gel 8 is preferably more than or equal to $\Delta L_{min}$ in the temperature range from the temperature in the state under application of no stress, i.e., the temperature upon disposing holding plate 10 in semiconductor device 100 to the lowest temperature at which semiconductor device 100 is used. This is because compressive stress is preferably always applied to insulating substrate 5 in the operating temperature range of semiconductor device 100.

For example, when holding plate 10 is disposed at the room temperature (25° C.) in the case where the lowest temperature environment in which semiconductor device 100 is used is −40° C., ΔTmin is 65° C. and pressing amount ΔLmin is set accordingly. For example, ΔLmin=1.7 mm in the case of a semiconductor device in which sealing is performed up to a height of 20 mm with a resin having volumetric expansion coefficient β of 1300 ppm/K. By pressing the holding plate more greatly than ΔLmin, the holding plate is always placed in the gel also at a low temperature, thereby applying compressive stress.

Moreover, when holding plate 10 is disposed at the temperature of −40° C., i.e., the lowest temperature at which semiconductor device 100 is used, ΔTmin is 0° C. and pressing amount ΔLmin is therefore 0 mm. That is, when holding plate 10 is merely on and in close contact with the surface of silicone gel 8, compressive stress is always applied to power semiconductor element 4 and insulating substrate 5 below holding plate 10 under the operating environment of semiconductor device 100, whereby a reliable semiconductor device can be manufactured. Therefore, growth of bubbles and detachment can be suppressed under the operating environment temperature of semiconductor device 100, and detachment of silicone gel 8 from insulating substrate 5 can be suppressed, thereby obtaining an effect of suppressing insulation deterioration of the power module.

It should be noted that even with a pressing amount of less than or equal to ΔLmin, there is obtained the effect of suppressing the bubbles and detachment, which are caused from an interface between silicone gel 8 and power semiconductor element 4 or insulating substrate 5.

Next, the following describes a step of fixing cover 9 to case member 2. FIG. 11 shows a state after fixing cover 9 to the case. A method for fixing cover 9 having holding plate 10 disposed thereon is not limited particularly as long as holding plate 10 is fixed at a predetermined height; however, cover 9 can be fixed by using an adhesive agent or by fastening screws.

In the case where cover 9 is fixed to case member 2 using an adhesive agent, an uncured adhesive agent is introduced into a syringe, and is applied to required portions of cover 9 and case member 2 using a device such as a dispenser. After adhering cover 9 to case member 2, they are pressed using a jig to fix cover 9 and holding plate 10 at predetermined heights. After curing the adhesive agent under a predetermined curing condition, the pressing jig is removed. For example, when KE-1833, which is a silicone resin provided by Shin-Etsu Chemical Co. Ltd., is used as the adhesive agent, the curing process is performed for 1 hour at 120° C. After the adhesive agent is cured, the jig is cooled to the room temperature and is removed, thereby producing semiconductor device 100 in which silicone gel 8 is compressed by holding plate 10.

The adhesive agent for cover 9 and case member 2 is not limited particularly as long as fixed cover 9 is not separated from case member 2 due to force resulting from thermal expansion of silicone gel 8 during a high temperature operation of semiconductor device 100; however, the adhesive strength of the adhesive agent with respect to the case member is preferably more than or equal to 1.5 MPa.

In the case where cover 9 is fixed to case member 2 by fastening screws, threaded holes are provided in case member 2, and screws are fastened uniformly into the provided threaded holes such that silicone gel 8 is at a predetermined height when pressing by holding plate 10. The number of the screws for fastening is not limited in particular; however, an even number of screws are preferably provided to equally provide force for compressing silicone gel 8 of holding plate 10.

Semiconductor device 100 can be manufactured by such a manufacturing method.

The following describes features of semiconductor device 100 produced by such a manufacturing method. In a semiconductor device manufactured by disposing a conventional holding plate at a predetermined position of the semiconductor device before providing silicone gel and by curing the silicone gel at a predetermined temperature, the silicone gel is thermally expanded under a high temperature environment. Hence, the silicone gel expanded below the holding plate is suppressed by the holding plate from being expanded and compressive stress is accordingly applied to below the holding plate, thereby suppressing occurrence of bubbles and detachment below the holding plate.

However, since the silicone gel is thermally contracted under a low temperature environment less than or equal to the curing temperature of the silicone gel, the silicone gel contracted below the holding plate causes generation of tensile stress in all the direction including the holding plate that is in close contact therewith. Accordingly, tensile stress toward the cover thereabove is also generated at the bottom surface portion of the semiconductor device at which the power semiconductor element and the insulating substrate below the holding plate exist. This may promote occurrence of bubbles and detachment.

However, in semiconductor device 100 manufactured by the manufacturing method of the present embodiment, holding plate 10 is pressed from the surface of silicone gel 8 after curing silicone gel 8 so as to apply compressive stress to power semiconductor element 4 and insulating substrate 5. By applying a pressing amount of more than or equal to ΔLmin, compressive stress is applied even when silicone gel 8 is contracted in the lowest temperature region under the operating environment of semiconductor device 100. Thus, not only during the expansion of silicone gel 8 under the high temperature environment but also during the contraction thereof under the low temperature environment, growth of bubbles or detachment caused from power semiconductor element 4 and insulating substrate 5 can be suppressed below holding plate 10, whereby the insulation reliability of semiconductor device 100 can be improved.

In semiconductor device 100 configured as described above, compressive stress can be applied to power semiconductor element 4 and insulating substrate 5 below holding plate 10 upon the expansion of silicone gel 8 under the high temperature operating environment of semiconductor device 100, and compressive stress is also applied to power semiconductor element 4 and insulating substrate 5 below holding plate 10 upon the contraction of silicone gel 8 under the low temperature operating environment, whereby the insulation reliability of the semiconductor device is improved.

Moreover, silicone gel 8 is thermally expanded at a high temperature and expanded silicone gel 8 is pushed down by holding plate 10, whereby the internal stress of silicone gel 8 becomes compressive stress in the direction toward insulating substrate 5 below holding plate 10, thereby suppressing growth of bubbles or detachment. Accordingly, the effect of suppressing the insulation deterioration of the semiconductor device can be obtained.

Further, although the compressive stress in the direction toward insulating substrate 5 is reduced at a low temperature as compared with the compressive stress at the high temperature because silicone gel 8 is thermally contracted at the low temperature, the compressive stress is applied, so that growth of bubbles and growth of detachment can be suppressed. Accordingly, a reliable semiconductor device can be obtained.

The embodiments described are illustrative and non-restrictive in any respect. The scope of the present invention is defined by the terms of the claims, rather than the embodiments described above, and is intended to include any modifications within the scope and meaning equivalent to the terms of the claims.

Moreover, the invention may be made by appropriately combining a plurality of components disclosed in the above-described embodiments.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

EXAMPLES

In the present example, the following describes a result of conducting a heat cycle test in which holding plate 10 was mounted on a test semiconductor device 100 with the pressing amount and size of holding plate 10 being changed. The heat cycle test was conducted by placing the whole of semiconductor device 100 in a temperature-controlled chamber capable of controlling a temperature and by repeatedly changing the temperature of the temperature-controlled chamber between −40° C. and 150° C.

In semiconductor device 100 for evaluation, base plate 1 had a size of 90×140 mm and one substrate employing Si3N4 with a size of 50×60 mm was used for insulating substrate 5. As power semiconductor elements 4, four IGBTs each with a size of 11×12 mm were used. For bonding wire 6, aluminum with a wire diameter of 0.4 mm was used. For silicone gel 8 for sealing, WACKER SilGel612 provided by Wacker Asahikasei Silicone Co. Ltd., was employed. Each of case member 2, cover 9, and holding plate 10 was produced using PPS resin Z240 provided by DIC Corporation.

Semiconductor device 100 including the above-described members was not subjected to a reduced pressure process in order to promote occurrence of bubbles in silicone gel 8 and detachment, and was produced by introducing 160 g of silicone gel 8 under an atmospheric pressure, leaving silicone gel 8 for 30 minutes under the atmospheric pressure, and curing silicone gel 8 at 70° C./1 hr. Holding plate 10 is produced by cutting PPS having a thickness of 20 mm into a predetermined size and adhering it to the backside surface of cover 9 using a silicone adhesive agent.

For the result of the heat cycle test, determination was made as to whether or not bubbles are generated in the silicone gel and whether or not detachment occurs between the silicone gel and each of the various members. In the determination, ○ represents a case where the number of generated bubbles is 0 in visual observation, Δ represents a case where the number of generated bubbles is 1 to 4 in the visual observation, and × represents a case where the number of generated bubbles is equal to or more than 5 in the visual observation. Meanwhile, regarding the detachment, ○ represents a case where there occur no detachment and crack at an interface between silicone gel 8 and each of the various members, and × represents a case where there occur detachment and crack at the interface between silicone gel 8 and each of the various members.

Figure 15:
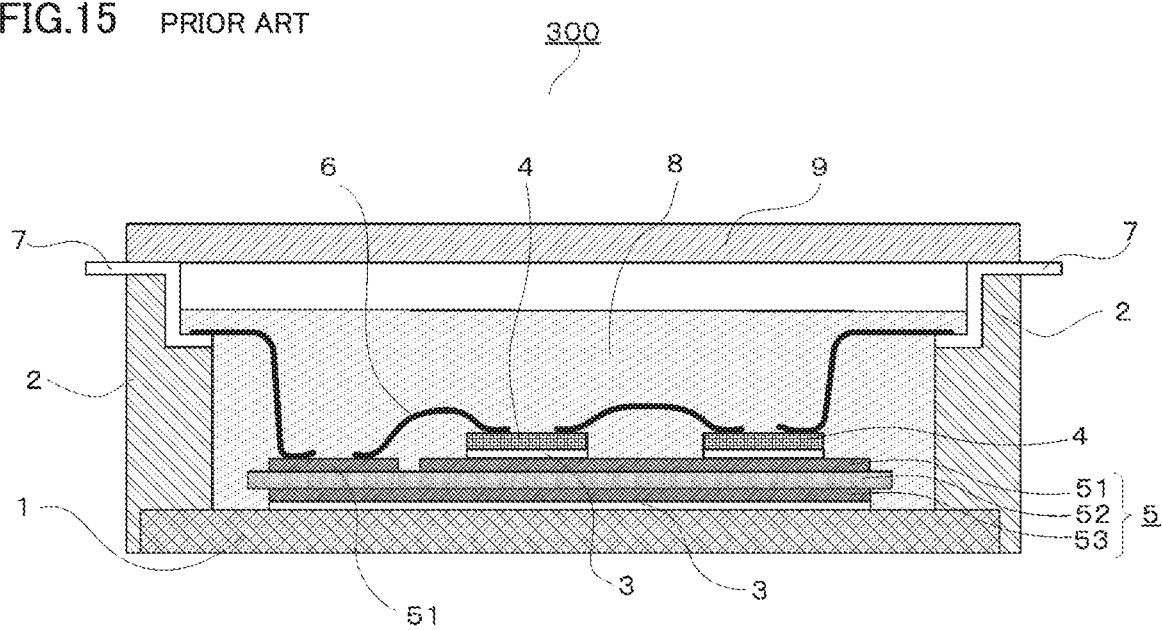
FIG. 15 is a schematic cross sectional structure view of a conventional semiconductor device.

FIG. 15 is a schematic cross sectional structure view of a conventional semiconductor device. FIG. 15 shows that in a conventional semiconductor device 300 according to Comparative Example 1, no holding plate 10 such as the one in the first embodiment was provided on cover 9.

Table 1 shows a relation between the pressing amount of each produced and evaluated holding plate and the heat cycle test. The samples were produced by disposing holding plate 10 having a size of 50×60 mm just above insulating substrate 5 and by variously changing the pressing amount under a temperature environment of 25° C. The heat cycle test was conducted under the following three conditions: the pressing amount of holding plate 10 was 0 mm (Comparative Example 1); the pressing amount of holding plate 10 was 1 mm (Example 2); and the pressing amount of holding plate 10 was 3 mm (Example 1).

TABLE 1

| Reliability Test (Heat Cycle Test: −40° C./150° C.) | | | | | |
| --- | --- | --- | --- | --- | --- |
| Number of Test Cycles/cyc | | 0 | 250 | 500 | 1000 |
| With No Holding Plate (Pressed by 0 mm) | Bubbles | ○ | × | × | × |
| | Detachment | ○ | ○ | × | × |
| With Holding Plate (Pressed by 1 mm) | Bubbles | ○ | Δ | Δ | Δ |
| | Detachment | ○ | ○ | ○ | ○ |
| With Holding Plate (Pressed by 3 mm) | Bubbles | ○ | ○ | ○ | ○ |
| | Detachment | ○ | ○ | ○ | ○ |

According to Table 1, in the sample with no holding plate 10 in Comparative Example 1, some bubbles were generated from a lower portion of joining material 3 of insulating substrate 5 at 250 cyc in the heat cycle test. On the other hand, in each of the samples with holding plates 10 in Examples 1, 2, it was found that occurrence of bubbles and detachment are suppressed. Meanwhile, some bubbles were confirmed in the sample of Example 2 in which the pressing amount of holding plate 10 was set at 1 mm. However, in the sample of Example 1 in which the pressing amount of holding plate 10 was set at 3 mm, it was found that occurrence of bubbles and detachment was not observed even after 1000 cyc of the heat cycle test.

According to the result above, it was found that occurrence of bubbles and detachment is suppressed by disposing holding plate 10 above power semiconductor element 4 and insulating substrate 5 to always apply compressive stress to silicone gel 8. Also, it was found that as the pressing amount of holding plate 10 is larger, it is more effective to suppress occurrence of bubbles and detachment.

Table 2 shows a relation between the size of each produced and evaluated holding plate and the heat cycle test. The samples were produced by variously changing the size of holding plate 10, disposing holding plate 10 just above insulating substrate 5, and pressing holding plate 10 by a set pressing amount of 3 mm under the temperature environment of 25° C. The size of the holding plate was set at 10×15 mm (Example 2), 25×30 mm (Example 3), 30×50 mm (Example 4), 50×60 mm (Example 1), and 84×120 mm (Example 5). The holding plate was centered on insulating substrate 5.

TABLE 2

| Reliability Test (Heat Cycle Test: −40° C./150° C.) | | | | | |
|---|---|---|---|---|---|
| Number of Test Cycles/cyc | | 0 | 250 | 500 | 1000 |
| Size of Holding Plate (10 × 15 mm) | Bubbles | ○ | x | x | x |
| | Detachment | ○ | ○ | x | x |
| Size of Holding Plate (25 × 30 mm) | Bubbles | ○ | Δ | Δ | x |
| | Detachment | ○ | ○ | ○ | x |
| Size of Holding Plate (30 × 50 mm) | Bubbles | ○ | ○ | ○ | ○ |
| | Detachment | ○ | ○ | ○ | ○ |
| Size of Holding Plate (50 × 60 mm) | Bubbles | ○ | ○ | ○ | ○ |
| | Detachment | ○ | ○ | ○ | ○ |
| Size of Holding Plate (84 × 120 mm) | Bubbles | ○ | ○ | ○ | ○ |
| | Detachment | ○ | x | x | x |

According to Table 2, regarding occurrence of bubbles and detachment, the same result as that of the sample with no holding plate 10 as shown in Table 1 was obtained for the sample of Example 2 in which the size of the holding plate was 10×15 mm. Thus, when the size of holding plate 10 was 5% of the area of insulating substrate 5, the bubble and detachment suppression effect by the compression with respect to power semiconductor element 4 and insulating substrate 5 was hardly observed.

In the sample of Example 3 in which the size of the holding plate was 25×30 mm, it was found that occurrence of bubbles and detachment can be suppressed as compared with the sample with no holding plate 10 as shown in Table 1. Although occurrence of bubbles from a portion above which holding plate 10 was disposed was not confirmed, bubbles were confirmed to be generated from joining material 3 at the lower portion of insulating substrate 5 when the size of holding plate 10 was 25% of the area of insulating substrate 5 and holding plate 10 did not exist above the outer periphery of insulating substrate 5.

In the sample of Example 4 in which the size of the holding plate was 30×50 mm, it was found that occurrence of bubbles and detachment can be suppressed as compared with the sample with no holding plate 10 as shown in Table 1. It was found that when the size of holding plate 10 is 50% of the area of insulating substrate 5, occurrence of bubbles and detachment are not observed even after 1000 cyc of the heat cycle test.

In the sample of Example 1 in which the size of holding plate 10 was 50×60 mm, it was found that occurrence of bubbles and detachment can be suppressed as compared with the sample with no holding plate 10 as shown in Table 1. It was found that when the size of holding plate 10 is as large as the area of insulating substrate 5, occurrence of bubbles and detachment are not observed even after 1000 cyc of the heat cycle test.

In the sample of Example 5 in which the size of holding plate 10 was 84×120 mm, it was found that occurrence of bubbles and detachment can be suppressed as compared with the sample with no holding plate 10 as shown in Table 1. Although occurrence of bubbles from a portion above which holding plate 10 was disposed was not confirmed, when the size of the holding plate was more than or equal to 80% of the area of the outermost surface of silicone gel 8 of semiconductor device 100 (when the contact region was more than or equal to 80% thereof), detachment from a side surface of case member 2 and crack of the silicone gel from a side surface of holding plate 10 were confirmed at 250 cyc of the heat cycle test. This is presumably due to the following reason. That is, when the size of holding plate 10 was more than or equal to 80% of the size of base plate 1 of semiconductor device 100, silicone gel 8 expanded at a high temperature was intensively concentrated on the portion not covered with holding plate 10, i.e., portion that is less than or equal to 20% thereof, with the result that an amount of displacement of silicone gel 8 became large to result in the detachment of silicone gel 8 from case member 2 and the crack of silicone gel 8. Hence, in order to suppress the detachment and crack, it was found that the contact region of holding plate 10 with silicone gel 8 should be less than 80%.

According to the result above, since insulating substrate 5 is covered with holding plate 10, the occurrence of bubbles and detachment can be suppressed. Moreover, the detachment and crack can be suppressed when the area of the holding plate is more than or equal to 50% of the area of insulating substrate 5 and the contact area thereof with the surface of silicone gel 8 is less than 80%.

REFERENCE SIGNS LIST

1: base plate; 2: case; 3: joining material; 4: power semiconductor element; 5: insulating substrate; 6: bonding wire; 7: electrode terminal; 8: silicone gel; 9: cover; 10: holding plate; 51, 53: electrode pattern; 52: insulating layer; 100, 200, 300: semiconductor device; 101: protrusion; 102: bar; 103: plate.

The invention claimed is:

1. A semiconductor device comprising:
an insulating substrate having an upper surface on which a semiconductor element is mounted;
a base plate joined to a lower surface of the insulating substrate;
a case member that surrounds the insulating substrate and that is in contact with a surface of the base plate to which the insulating substrate is joined;
a sealing resin provided in a region surrounded by the base plate and the case member, so as to seal the insulating substrate;
a cover member facing a surface of the sealing resin and fixed to the case member; and
a holding plate, a lower surface of the holding plate being in close contact with the surface of the sealing resin, an upper surface of the holding plate being fixed to a surface of the cover member facing the surface of the sealing resin, a size of the holding plate being more than or equal to 50% of an area of the insulating substrate, the size of the holding plate being less than 80% of an area of the surface of the sealing resin.

2. The semiconductor device according to claim 1, wherein the holding plate is on and in contact with the surface of the sealing resin cured.

3. The semiconductor device according to claim 1, wherein the holding plate is disposed above the insulating substrate.

4. The semiconductor device according to claim 1, wherein the holding plate is always in close contact with the sealing resin in a temperature range in which use of the semiconductor device is permitted.

5. The semiconductor device according to claim 1, wherein a plurality of divided portions of the holding plate are disposed.

6. The semiconductor device according to claim 1, wherein the holding plate is composed of a material different from a material of the cover member.

7. The semiconductor device according to claim 1, wherein the sealing resin has a portion not covered with the holding plate between a side surface of the holding plate and a side surface of the case member.

8. A method for manufacturing a semiconductor device, the method comprising:
   providing a sealing resin to a region surrounded by a base plate and a case member;
   curing the provided sealing resin;
   bringing a holding plate into close contact with the cured sealing resin; and
   fixing the holding plate at a predetermined height,
   a size of the holding plate being more than or equal to 50% of an area of the insulating substrate, the size of the holding plate being less than 80% of an area of the surface of the sealing resin.

9. The method for manufacturing the semiconductor device according to claim 8, wherein in the bringing of the holding plate into close contact, the sealing resin is pressed by the holding plate in a direction toward the base plate.

10. The method for manufacturing a semiconductor device according to claim 8, wherein the bringing of the holding plate into close contact is performed at a lowest temperature in a temperature range from −40 degrees to 150 degrees in which use of the semiconductor device is permitted.

* * * * *